US012130306B2

(12) United States Patent
Bang et al.

(10) Patent No.: US 12,130,306 B2
(45) Date of Patent: Oct. 29, 2024

(54) MODULE SUBSTRATE FOR SEMICONDUCTOR MODULE, SEMICONDUCTOR MODULE AND TEST SOCKET FOR TESTING THE SAME

(71) Applicant: SAMSUNG ELECTRONICS CO., LTD., Suwon-si (KR)

(72) Inventors: Kwangkyu Bang, Hwaseong-si (KR); Kiljoong Yun, Hwaseong-si (KR); Yun Chang, Hwaseong-si (KR); Jaegyu Choi, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 261 days.

(21) Appl. No.: 17/884,661

(22) Filed: Aug. 10, 2022

(65) Prior Publication Data

US 2023/0213554 A1 Jul. 6, 2023

(30) Foreign Application Priority Data

Jan. 3, 2022 (KR) .......................... 10-2022-0000171

(51) Int. Cl.
*G01R 1/04* (2006.01)
*G01R 31/28* (2006.01)

(52) U.S. Cl.
CPC ......... *G01R 1/0466* (2013.01); *G01R 1/0483* (2013.01); *G01R 31/2863* (2013.01); *G01R 31/2884* (2013.01)

(58) Field of Classification Search
CPC ................ G01R 1/0466; G01R 1/0483; G01R 31/2863; G01R 31/2884
See application file for complete search history.

(56) References Cited

U.S. PATENT DOCUMENTS

| 7,145,353 | B2 * | 12/2006 | Hope ................. G01R 31/2635 |
| | | | 324/754.2 |
| 7,301,103 | B2 * | 11/2007 | Tanaka .................. H05K 1/116 |
| | | | 174/250 |
| 7,552,531 | B2 | 6/2009 | Takada et al. |

(Continued)

FOREIGN PATENT DOCUMENTS

| KR | 10-1326298 | 10/2013 |
| KR | 10-1447363 | 9/2014 |

(Continued)

*Primary Examiner* — Paresh Patel
(74) *Attorney, Agent, or Firm* — F. CHAU & ASSOCIATES, LLC

(57) ABSTRACT

A module substrate for a semiconductor module includes: a wiring substrate having an upper surface and a lower surface opposite to the upper surface, wherein the wiring substrate includes a circuit wiring and a plurality of via holes extending from the upper surface to the lower surface in a thickness direction; a plurality of test terminals respectively provided on the via holes and electrically connected to the circuit wiring, and a fastening thin film provided on the wiring substrate and covering the via holes, wherein the fastening thin film has a predetermined thickness such that a portion of the fastening thin film is penetrated when an interface is pin is inserted into the portion of the fastening thin film through the via hole from the upper surface, and the portion of the penetrated fastening thin film holds the penetrating interface inspection pin.

20 Claims, 15 Drawing Sheets

(56) References Cited

U.S. PATENT DOCUMENTS

| | | |
|---|---|---|
| 10,317,459 B2 | 6/2019 | Chadha et al. |
| 10,393,799 B2 | 8/2019 | Kim |
| 2016/0047855 A1 | 2/2016 | Bhunia et al. |
| 2021/0118810 A1 | 4/2021 | Kim et al. |

FOREIGN PATENT DOCUMENTS

| | | |
|---|---|---|
| KR | 10-1794601 | 11/2017 |
| KR | 10-2191699 | 12/2020 |

* cited by examiner

MODULE SUBSTRATE FOR SEMICONDUCTOR MODULE, SEMICONDUCTOR MODULE AND TEST SOCKET FOR TESTING THE SAME

CROSS-REFERENCE TO RELATED APPLICATION

This application claims priority under 35 U.S.C. § 119 to Korean Patent Application No. 10-2022-0000171, filed on Jan. 3, 2022 in the Korean Intellectual Property Office (KIPO), the disclosure of which is incorporated by reference herein in its entirety.

TECHNICAL FIELD

Example embodiments of the present inventive concept relate to a module substrate for a semiconductor module, a semiconductor module and a test socket for testing the same. More particularly, example embodiments of the present inventive concept relate to a module substrate for a semiconductor module subject to a reliability test, a semiconductor module and a test socket for testing the same.

DISCUSSION OF THE RELATED ART

Recently, a storage device such as a solid state drive (SSD) including a memory devices has been widely used. Since the storage device does not include a mechanical driving portion, the storage device has excellent stability, excellent durability, and has relatively fast reading and writing of information. In addition, the storage device is used in electronic circuits of various types of systems, such as notebook computers, automobiles, aircraft, drones, and the like.

Generally, since the storage device is miniaturized, the SSD may be inside a system that is within a shield can. In this case, electrical hazards (e.g., Short, EOS (Electrical Over Stress), Internal POR (Power of Reset), ESD (Electro Static Discharge)) may occur when the SSD is connected to a metal shield can from the outside, and a method capable of efficiently analyzing abnormalities, malfunctions and defects while using the device while preventing electrical hazards may be desirable.

SUMMARY

According to an example embodiment of the present inventive concept, a module substrate for a semiconductor module includes: a wiring substrate having an upper surface and a lower surface opposite to the upper surface, wherein the wiring substrate includes a circuit wiring and a plurality of via holes extending from the upper surface to the lower surface in a thickness direction, a plurality of test terminals respectively provided on the via holes and electrically connected to the circuit wiring, and a fastening thin film provided on the wiring substrate and covering the via holes, wherein the fastening thin film has a predetermined thickness such that a portion of the fastening thin film is penetrated when an interface inspection pin is inserted into the portion of the fastening thin film through the via hole from the upper surface, and the portion of the penetrated fastening thin film holds the penetrating interface inspection pin.

According to an example embodiment of the present inventive concept, a semiconductor module includes: a wiring substrate having first and second surfaces opposite to each other, wherein the wiring substrate includes a circuit wiring and a plurality of via holes formed through the wiring substrate in a thickness direction; at least one semiconductor device mounted on the wiring substrate and electrically connected to the circuit wiring; a plurality of test terminals respectively provided on the via holes and electrically connected to the circuit wiring to electrically test the at least one semiconductor device; and a fastening thin film provided on the wiring, substrate and covering the via holes, wherein the fastening thin film has a predetermined thickness within a range of about 1 µm to about 200 µm, wherein the fastening thin film is penetrated by an interface inspection pin inserted through a first via hole of the plurality of via holes from the first surface, and a portion of the penetrated fastening thin film contacts and holds the penetrating interface inspection pin.

According to an example embodiment of the present inventive concept, a test socket for a semiconductor substrate includes: a first body including a fixing portion for fixing the semiconductor substrate; a second body disposed to face the first body, wherein the second body is coupled with the first body such that the second body rotates relative to the first body about a hinge pin as a fixed axis of rotation; and a plurality of interface inspection pins, wherein each of the interface inspection pins has a convex shaped contact pin and a spring connected to the contact pin, wherein each of the convex shaped contact pins is provided in a first end portion of each of the interface inspection pins, wherein the semiconductor substrate includes, a wiring substrate having a first surface and a second surface opposite to each other, wherein the wiring substrate includes a plurality of via holes extending from the first surface to the second surface, wherein an interface inspection pin of the plurality of interface inspection pins is inserted through a via hole of the plurality of via holes; a test terminal provided on an inner surface of the via hole to be in contact with a contact pin of the interface inspection pin of the plurality of interface inspection pins; and a fastening thin film being provided on the second surface, wherein the fastening thin film has a predetermined thickness and a predetermined structure such that a portion of the fastening thin film is penetrated by the contact pin to hold the interface inspection pin in place.

Thus, in a test process, the interface inspection pin may come into contact with the test terminal and may penetrate the fastening thin film. The penetrated fastening thin film may fix the interface inspection pin in a process of being penetrated and may prevent the test terminal and the interface inspection pin being separated. Accordingly, it is possible to prevent a short circuit from occurring due to poor contact between the interface inspection pin and the test terminal, and an electric shock applied to an electronic device may be prevented.

In addition, when the module substrate for the semiconductor module is applied to a miniaturized storage device (SSD F/F (Form Factor)), it is possible to prevent problems with electrical hazards (a Short, an Electrical Over Stress (FOS), an Internal Power of Reset (POR), an Electro Static Discharge (ESD)) that may occur when using the external shield can as a case.

BRIEF DESCRIPTION OF THE DRAWINGS

The above and other features of the present inventive concept will become more apparent by describing in detail example embodiments thereof, with reference to the accompanying drawings, in which.

DETAILED DESCRIPTION OF EXAMPLE EMBODIMENTS

Hereinafter, example embodiments of the present inventive concept will be described in detail with reference to the accompanying drawings.

Figure 1:
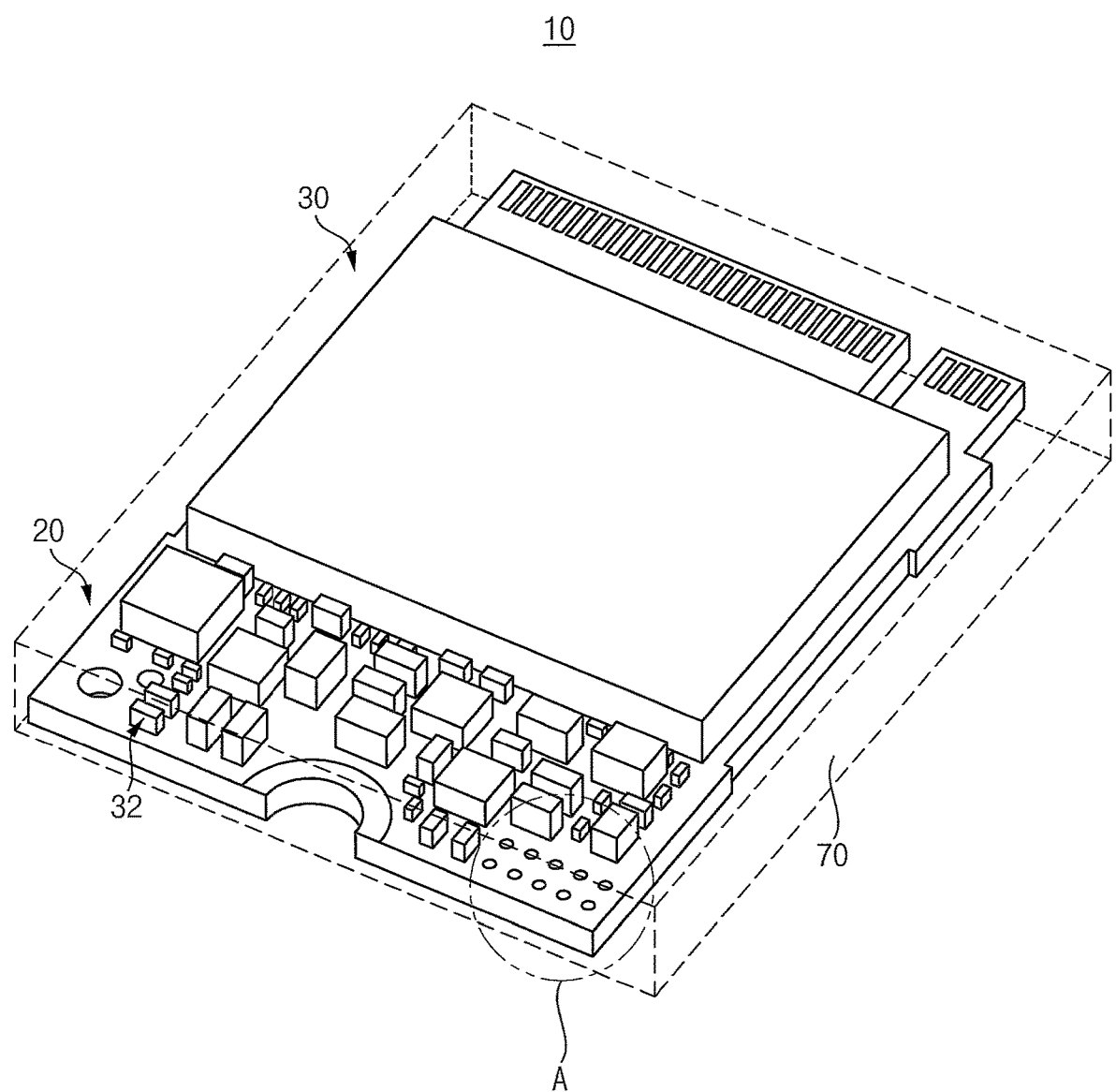
FIG. 1 is a perspective view illustrating an electronic device in accordance with an example embodiment of the present inventive concept.
Figure 2:
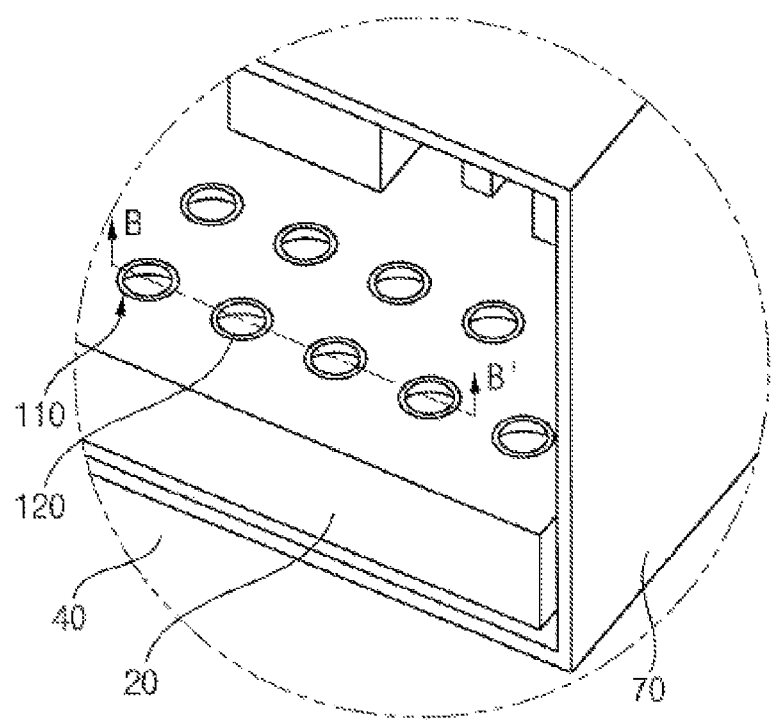
FIG. 2 is an enlarged perspective view illustrating the portion 'A' in FIG. 1.
Figure 3:
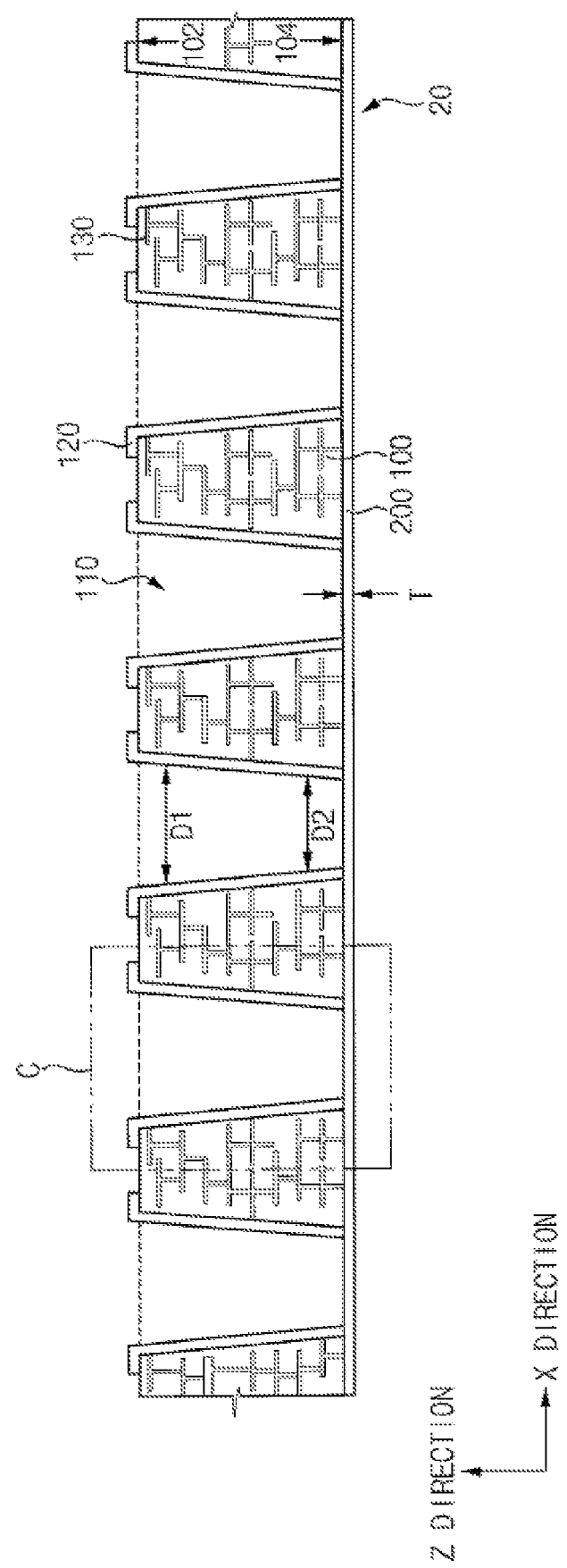
FIG. 3 is a cross-sectional view taken along the line B-B' in FIG. 2.
Figure 4:
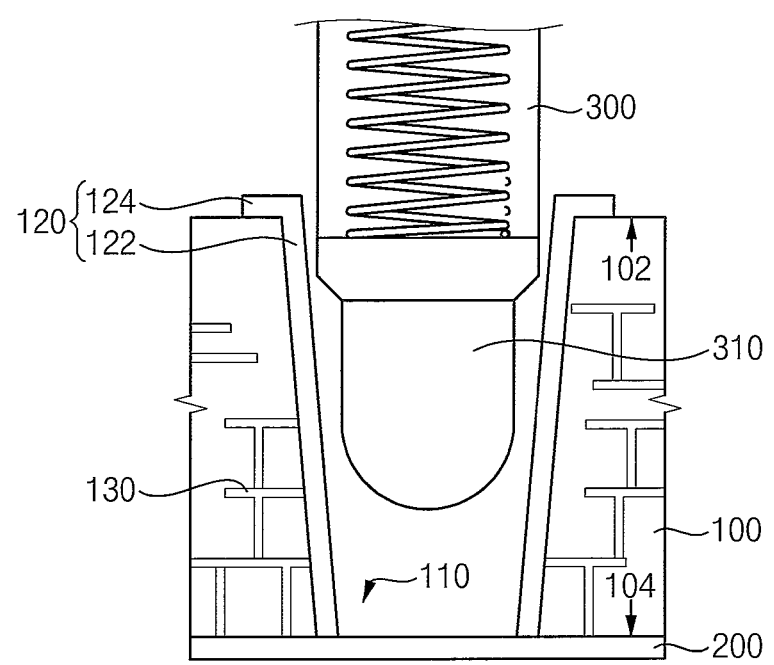
FIG. 4 is an enlarged cross-sectional view illustrating the portion 'C' in FIG. 3.

FIG. 1 is a perspective view illustrating an electronic device in accordance with an example embodiment of the present inventive concept. FIG. 2 is an enlarged perspective view illustrating the portion 'A' in FIG. 1. FIG. 3 is a cross-sectional view taken along the line B-B' in FIG. 2. FIG. 4 is an enlarged cross-sectional view illustrating the portion 'C' in FIG. 3.

Referring to FIGS. 1 to 4, the electronic device 10 may include a module substrate 20, a semiconductor device 30 mounted on the module substrate 20, and a test pad portion 40 provided in a peripheral region of the module substrate 20. Additionally, the electronic device 10 may further include passive elements 32 disposed on the module substrate 20. The electronic device 10 may further include an interposer disposed on the module substrate 20 and a plurality of semiconductor components disposed on the interposer. The electronic device 10 may further include a metal shield can 70 covering the module substrate 20 to protect the module substrate 20 from an outside.

A test socket may be electrically connected to the electronic device 10 to perform a reliability test. As will be described later, interface inspection pins 300 of the test socket may be connected to a plurality of test terminals 120 to perform the reliability test on the electronic device 10. For example, the electronic device 10 may include a memory module such as a solid state drive (SSD). The SSD may be a storage medium including a NAND flash memory and a controller configured to control the same, and may be a storage device having high read and write speeds and low power consumption. The SSD may include various types such as 2.5" (U.2, U.3), EDSFF, M.2, etc.

In an example embodiment of the present invention, the semiconductor device 30 may include a BGA-type multi-chip package having an SSD controller, nonvolatile memory devices and a buffer memory device. The semiconductor device 30 may be mounted on the module substrate 20 such that the memory module 10 may be provided as the solid state drive (SSD). For example, the semiconductor device 30 may be mounted directly on the module substrate 20. The SSD may be used to replace hard drives used in PCs, notebook computers, and the like. In addition, the SSD may be used in mobile devices such as smart phones, tablet PCs, digital cameras, MP3 players, and PDAs.

The SSD controller may transmit and receive signals to and from a host through a host interface. The host interface may include, for example, Universal Serial Bus (USB), Small Computer System Interface (SCSI), PCI express, ATA, Parallel ATA (PATA), Serial ATA (SATA), Serial Attached SCSI (SAS), and the like. Here, the signals exchanged between the SSD controller and the host may include a command, an address, data, and the like. The SSD controller may analyze and process the signal received from the host.

A plurality of the nonvolatile memory devices may be used as a storage medium of the SSD. The nonvolatile memory device may include NAND flash memories. The nonvolatile memory devices may be connected to the SSD controller through at least one channel. The SSD may use a nonvolatile memory such as PRAM, MRAM, ReRAM, or FRAM as the storage medium instead of flash memory.

The buffer memory device may be used as a buffer area to temporarily store data received from the host or to temporarily store data read from the nonvolatile memory devices. For example, the buffer memory device may be used to drive software (S/W) used for efficient management of the nonvolatile memory devices. For example, the buffer memory device may be used to store metadata received from a host or to store cache data.

For example, the buffer memory device may include at least one DRAM chip. The SSD may replace DRAM with volatile memory such as SRAM, or may replace with nonvolatile memory such as flash memory, PRAM, MRAM, ReRAM, and FRAM.

In an example embodiment of the present inventive concept, the passive elements may be disposed on an upper surface or a lower surface of the module substrate 20. The passive elements may include, for example, inductors, capacitors, resistors, and the like.

In addition, the memory module 10 may further include a power management chip (e.g., Power Management Integrated Circuit, PMIC) for adjusting power of the semiconductor device.

In an example embodiment of the present inventive concept, the test pad portion 40 may include the test terminals 120 provided in the peripheral region of the module substrate 20 and configured to electrically test the semiconductor device 30. The test terminals 120 may be electrically connected to the semiconductor device 30 by circuit wirings such as signal lines. The semiconductor device 30 may be electrically tested by connecting the test terminals 120 to the interface inspection pin connected to a test board.

For example, the test pad portion may include 12 test terminals 120 arranged in a plurality of rows and columns (e.g., 2×6 pins). In this case, connection terminals of a tester may include 12 interface inspection pins corresponding to the arrangement of the test terminals 120 to connect to the test terminals 120. The test terminals 120 of the test pad portion may be used to debug a firmware code of the semiconductor device 30. For example, in a development and mass production stage of an SSD product, the test pad portion may use the test terminals 120 as input/output signal pins to find and correct logical errors or abnormal operations (e.g., bugs) when the semiconductor device 30 is driven.

In an example embodiment of the present inventive concept, the module substrate 20 may include a wiring substrate 100 having a plurality of via holes 110, a plurality of the test terminals 120 respectively provided on the via holes 110, and a fastening thin film 200 provided on the wiring substrate 100 and having a predetermined thickness. The fastening thin film 200 may be for reinforcing fastening properties.

For example, the module substrate 20 may be a printed circuit board (PCB). The printed circuit board may be a multilayer circuit board having vias and various circuits therein.

In an example embodiment of the present inventive concept, the wiring substrate 100 may have an upper surface (e.g., a first surface) and a lower surface (e.g., a second surface) opposite to each other. The wiring substrate 100 may include a plurality of the via holes 110 extending from the upper surface 102 to the lower surface 104 in a thickness direction and to which the interface inspection pins 300, which are connected to the test board, are inserted.

The wiring substrate 100 may further include a circuit wiring 130 therein. The wiring substrate 100 may include a plurality of stacked insulating layers, and the circuit wiring 130 may include conductive patterns respectively provided on the insulating layers. The circuit wiring 130 may be a circuit set for driving the SSD. The circuit wiring 130 may be referred to as the circuit set for electrically connecting the NAND flash memory and the controller to each other. For example, the wiring substrate 100 may include resin.

A plurality of the via holes 110 may provide a structure to facilitate a connection with the test socket 50 that is capable of performing the reliability test on the electronic device 10. Each of the via holes 110 may be provided to penetrate from the upper surface 102 to the lower surface 104 of the wiring substrate 100 in the thickness direction (Z direction). The via holes 110 may be provided with a predetermined depth, and accordingly a plurality of the interface inspection pins 300 of the test socket 50 may be inserted into the via holes 110, respectively.

The via holes 110 may be provided to correspond to the 12 test terminals 120. For example, the via holes 110 may be either 10-pin or 12-pin depending on the electronic device 10 that is to be tested.

The via holes 110 may be arranged in a plurality of rows along one side of the wiring substrate 100. For example, the via holes 110 may be arranged in two rows. For example, the via holes 110 may be arranged along the one side of the wiring substrate 100 such that the interface inspection pins 300 coming from the outside are inserted into the via holes 110, respectively. The via holes 110 may extend along the same axis as the interface inspection pins 300 such that the interface inspection pins 300 are inserted into the via holes 110, respectively.

The via holes 110 may be provided to be exposed to the outside from the cover 70 of the electronic device 10 such that the interface inspection pins 300 are inserted into the via holes 110. A plurality of the rows may be provided to correspond to the test socket. The via holes 110 may be positioned to correspond to positions of the interface inspection pins 300 provided on the test socket.

In an example embodiment of the present inventive concept, the test terminals 120 may be provided in the via holes 110, respectively, so that they come into contact with the interface inspection pins 300. Each of the test terminals 120 may surround an inner surface of its corresponding via hole 110 of the plurality of via holes 110 that penetrate through the wiring substrate 100. The test terminals 120 may include conductive materials. The test terminals 120 may be electrically connected to the circuit wirings that are inside the wiring substrate 100.

The interface inspection pins 300 of the test socket may contact the test terminals 120, respectively, to electrically connect the electronic device 10 to the test board provided in the test socket such that the electronic device 10 is tested. For example, the test terminal 120 may be a terminal electrically connected to a power supply voltage VDD of 1.8V.

The test terminal 120 may include a first terminal pattern 122 and a second terminal pattern 124. The first terminal pattern 122 may be provided in a form of a thin film disposed on the inner surface of the via hole 110 that penetrates through the wiring substrate 100. The second terminal pattern 124 extending from the first terminal pattern 122 and is disposed on the upper surface 102 of the wiring substrate 100. The first terminal pattern 122 may directly contact and be electrically connected to the circuit wiring 130 disposed inside the wiring substrate 100. The second terminal pattern 124 may fix the test terminal 120 to the via hole 110, and may directly contact with the interface inspection pin 300 to electrically connect the test board and the electronic device 10 to each other.

The test terminal 120 may have a first diameter D1 on the upper surface 102 of the wiring substrate 100 and a second diameter D2 on the lower surface 104 of the wiring substrate 100. The first diameter D1 may be equal to or greater than the second diameter D2. A longitudinal cross-section of the test terminal 120 may have, for example, a tapered shape. The diameter of the test terminal 120 may gradually decrease along an extending direction (e.g., a thickness direction) from the upper surface 102 to the lower surface 104. Since the first diameter D1 of the upper surface 102 is the same as or greater than the second diameter D2, the interface inspection pins 300 may be stably inserted into the test terminals 120, and the test terminals 120 may hold the inserted interface inspection pins 300 in place. In addition, test terminals 120 may have a sufficient depth and the interface inspection pins 300 may be inserted deep enough into the test terminals 120 for there to be a stable connection between the test terminals 120 and the interface inspection pins 300. For example, the first and second diameters D1 and D2 may be within a range of about 0.1 mm to about 1 mm.

For example, the conductive material of the test terminal 120 may include copper (Cu), aluminum (Al), tungsten (W), nickel (Ni), molybdenum (Mo), gold (Au), silver (Ag), chromium (Cr), tin (Sn), and/or titanium (Ti).

In an example embodiment of the present inventive concept, the fastening thin film 200 for reinforcing fastening properties may be provided in the form of the thin film on the lower surface 104 of the wiring substrate 100. The fastening thin film 200 may be penetrated by the interface inspection pins 300 during the test process, and the interface inspection pins 300 may be held in the penetrating process. The fastening thin film 200 may have openings formed by being penetrated by the interface inspection pins 300 after the test process.

The fastening thin film 200 may be provided in the form of a thin layer to contact with the lower surface 104 of the wiring substrate 100. For example, the fastening thin film 200 may be formed by a Controlled Depth Drilling (CDD) process in a manufacturing process of the module substrate 20. The fastening thin film 200 may be formed together in a process of forming the via holes 110 in the module substrate 20. The controlled depth drilling process may be used to form the via holes 110 in the module substrate 20, and may be performed until a layer below the via hole 110 is formed to have a predetermined thickness T. The layer of the module substrate 20 having the predetermined thickness T may be provided as the fastening thin film.

The fastening thin film 200 may have the predetermined thickness T such that the fastening thin film is destroyed and penetrated when an external force by contact with the interface inspection pin 300 is applied. The predetermined thickness T of the fastening thin film may be a thickness that can be penetrated when pressure is applied in the vertical direction (Z direction) by the interface inspection pins 300. For example, the predetermined thickness may be within a range of about 1 μm to about 200 μm.

The fastening thin film 200 may include a material that is easily destroyed and penetrated when the external force is applied by the interface inspection pin 300. The material may be referred to as a material that is easily penetrated when the pressure is applied by the interface inspection pins 300 in the vertical direction (Z direction). For example, the fastening thin film 200 may include resin. The fastening thin film 200 may lower a dielectric loss factor (Dissipation Factor, DF) by reducing a content of the resin.

The fastening thin film 200 may have a predetermined structure that is destroyed and penetrated when the external force is applied by contact with the interface inspection pin 300. For example, the predetermined structure may include a certain shape, a concave shape, a convex shape, and the like provided on the fastening thin film 200. The predetermined structure may be provided in a form corresponding to the interface inspection pins 300.

The interface inspection pin 300 may include a contact pin 310 for contacting with the test terminal 120, and a distal end portion of the contact pin 310 may penetrate the fastening thin film 200. The fastening thin film 200 may have a shape for penetrating the fastening thin film 200. For example, the fastening thin film 200 may have the predetermined structure including the certain shape, the concave shape, the convex shape, and the like at a position corresponding to the distal end portion of the contact pin 310. For example, the distal end portion of the contact pin 310 may have a round shape or a polygonal shape such as a square shape and a triangular shape.

Figure 5:
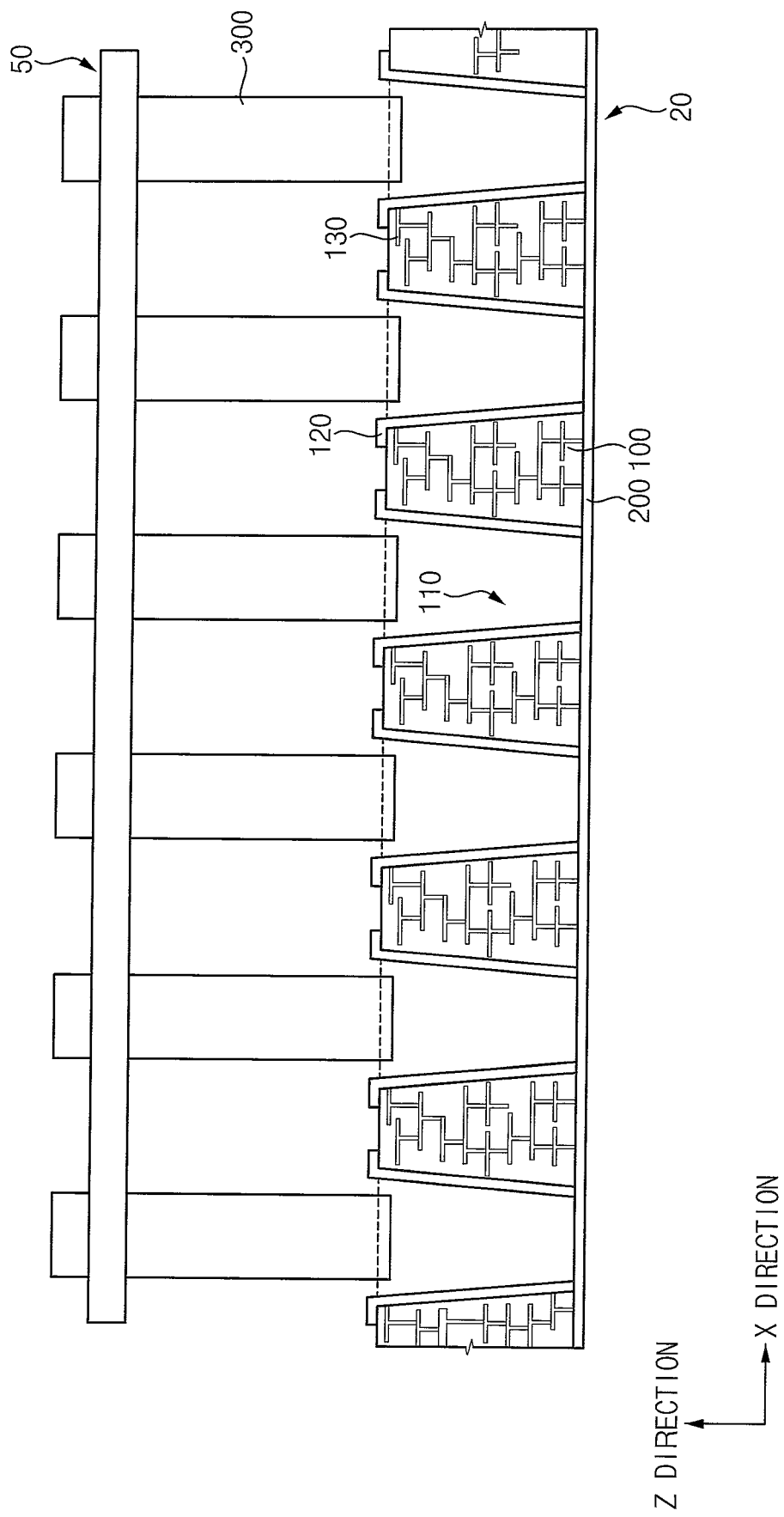
FIGS. 5, 6 and 7 are cross-sectional views illustrating a test process of a semiconductor substrate according to an example embodiment of the present inventive concept.
Figure 6:
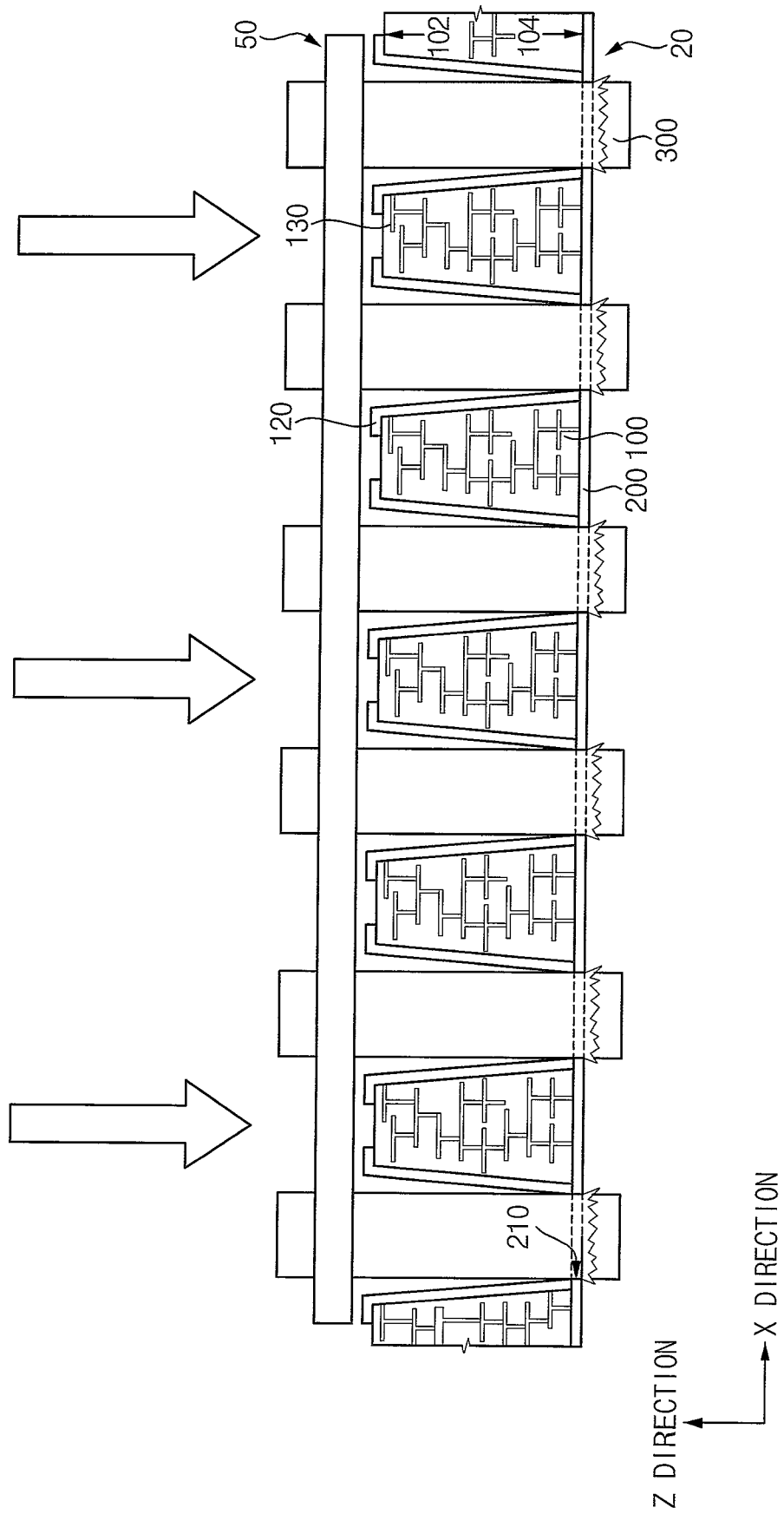
Figure 7:
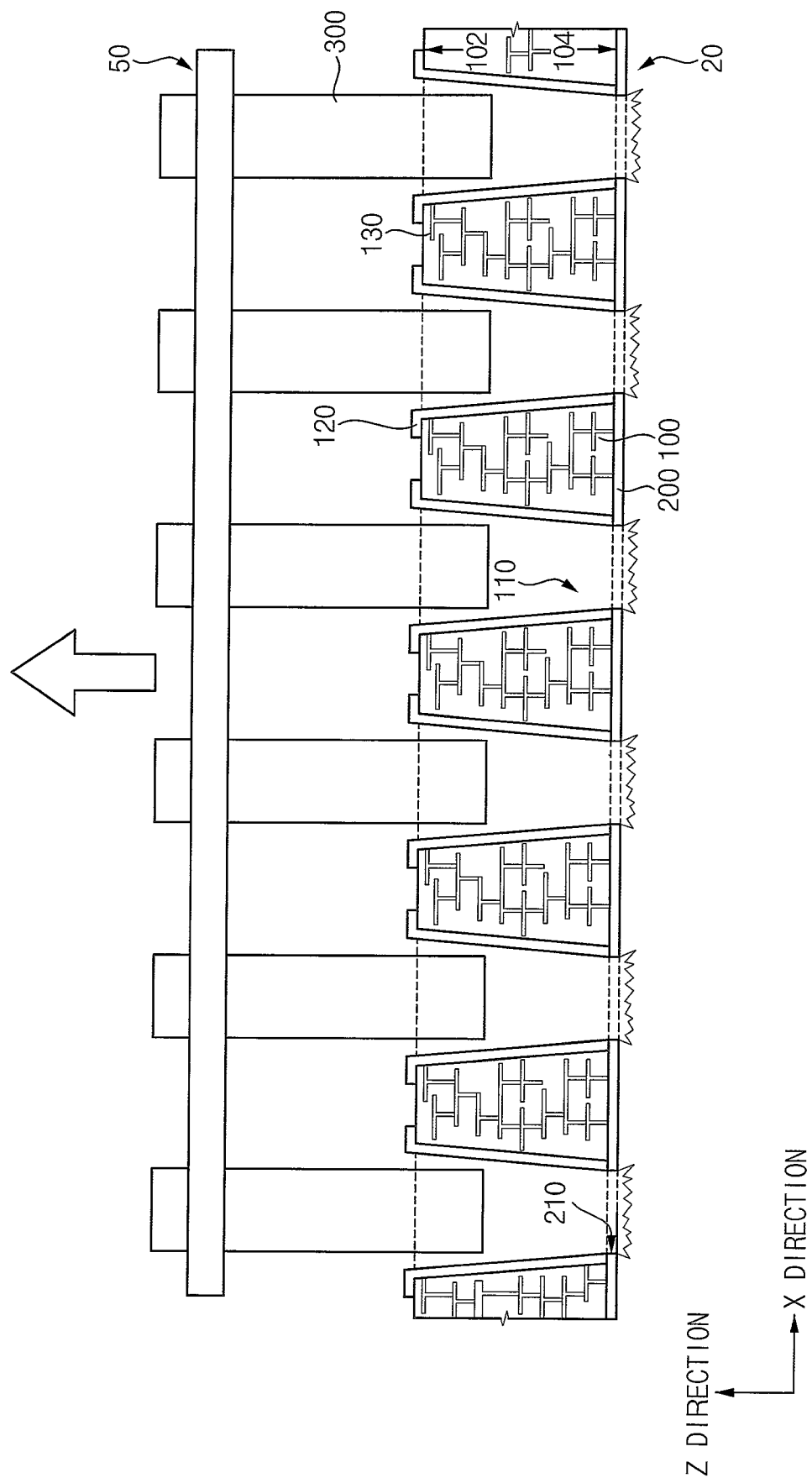

FIGS. 5 to 7 are cross-sectional views illustrating a test process of a semiconductor substrate according to an embodiment of the present inventive concept.

Referring to FIGS. 5 to 7, the module substrate 20 as a semiconductor substrate may be tested by the test socket 50 connected to the test board.

As illustrated in FIG. 5, the interface inspection pins 300 may be provided fixedly in a support portion of the test socket 50, and the semiconductor substrate 20 may be disposed in the test socket 50 such that the interface inspection pins 300 are located on the via holes 110 of the semiconductor substrate 20. The interface inspection pins 300 may be provided at positions respectively corresponding to the via holes 110. For example, the interface inspection pins 300 may have a T32 connector shape, and may be electrically connected to the test board through the T32 connector shape, but the present inventive concept is not limited thereto.

As illustrated in FIG. 6, the interface inspection, pins 300 may move in the vertical direction (Z direction) toward the semiconductor substrate 20. The interface inspection pins 300 may move toward the semiconductor substrate 20 by the pressure applied by, for example, an operator or a robot. The interface inspection pins 300 may contact the test terminals 120 while moving in the vertical direction (Z direction). Since the test terminals 120 have the predetermined first and second diameters D1 and D2, the interface inspection pins 300 are inserted into the test terminals 120 and are held by the test terminals 120.

The fastening thin film 200 may be completed penetrated a process of the interface inspection pins 300 moving in the vertical direction (Z direction). The openings 211) may be formed as the fastening thin film 200 is destroyed by the interface inspection pins 300, and the openings 210 may hold the interface inspection pins 300. The fastening thin film 200 having the openings 210 formed by the interface inspection pins 300 may have a surface roughness, and may provide an increased frictional force with the interface inspection pins 300.

The semiconductor substrate 20 may be tested with the test board while the interface inspection pins 300 are held by the openings 210 of the fastening thin film 200 and the test terminals 120.

As illustrated in FIG. 7, when the test is completed, the interface inspection pins 300 may be removed from the semiconductor substrate 20. The interface inspection pins 300 may move in the vertical direction (Z direction) opposite to the semiconductor substrate 20. The interface inspection pins 300 may be separated from the semiconductor substrate 20 by an external force applied by the operator or the robot. After the interface inspection pins 300 are removed from the semiconductor substrate 20, uneven structures and/or surfaces may be formed around the openings 210 of the semiconductor substrate 20.

As described above, in the test process, the interface inspection pins 300 may come into contact with the test terminals 120 and may penetrate the fastening thin film 200. The partially penetrated fastening thin film 200 may more hold the interface inspection pins 300 in the process of being penetrated, and may prevent the test terminal 120 and the interface inspection pin 300 from being separated from each other. Accordingly, it may be possible to prevent a short circuit from occurring due to poor contact between the interface inspection pin 300 and the test terminal 120, and accordingly an electric shock may be prevented from being applied to the electronic device 10.

Hereinafter, a test socket for testing the electronic device in FIG. 1 will be explained.

Figure 8:
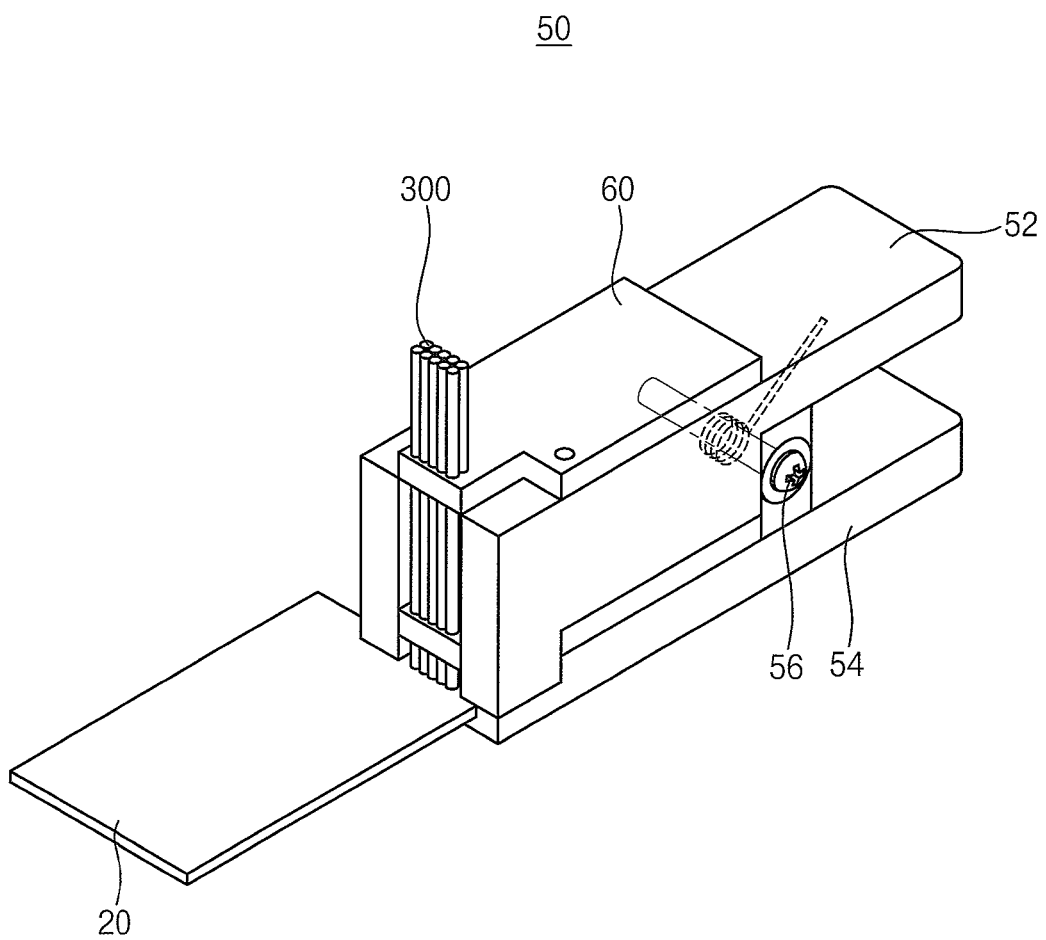
FIG. 8 is a perspective view illustrating a test socket for a semiconductor module in accordance with an example embodiment of the present inventive concept.
Figure 9:
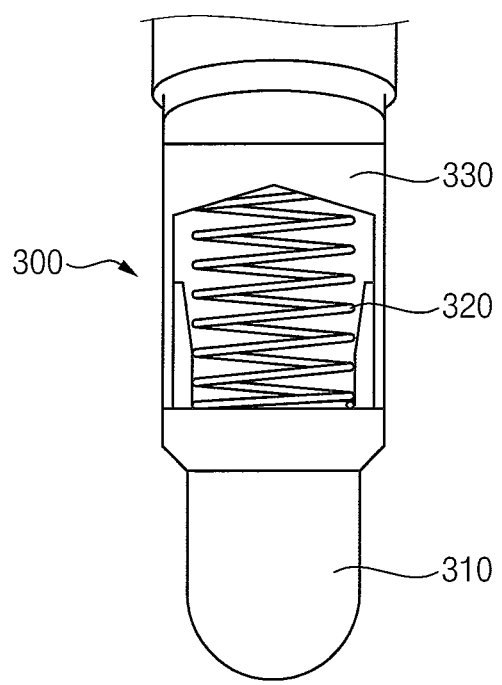
FIG. 9 is a cross-sectional view illustrating an interface inspection pin in FIG. 8.
Figure 10:
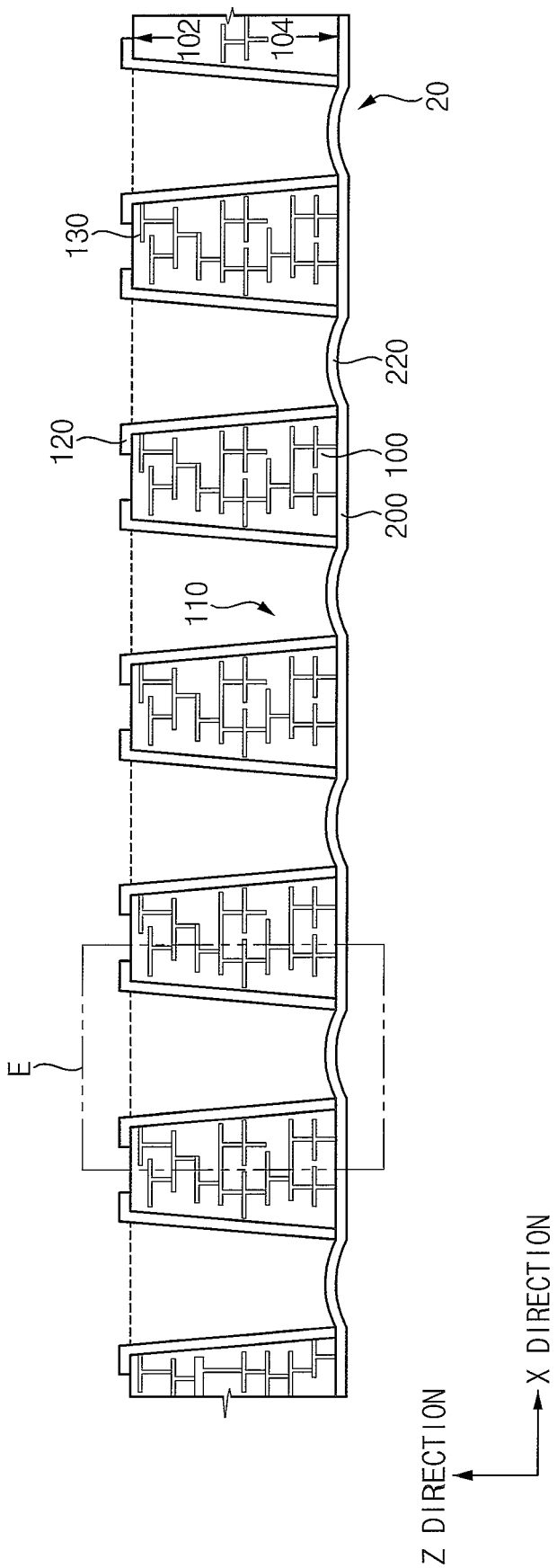
FIG. 10 is a cross-sectional view illustrating a fastening thin film of a module substrate in accordance with an example embodiment of the present inventive concept.
Figure 11:
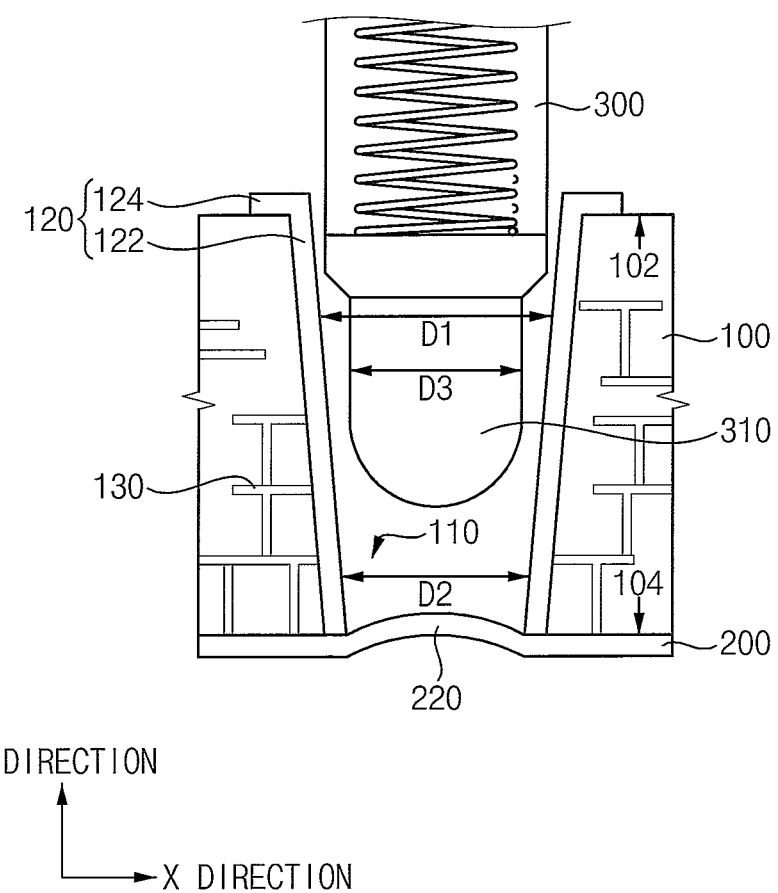
FIGS. 11 and 12 are enlarged perspective views illustrating the portion 'E' in FIG. 10.
Figure 12:
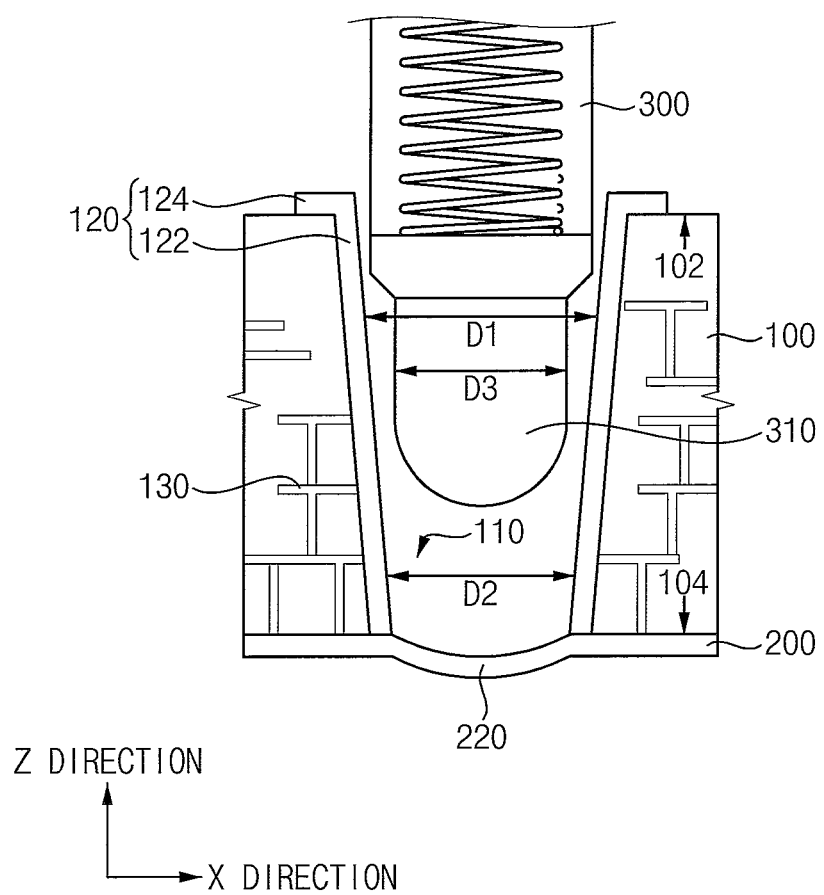

FIG. 8 is a perspective view illustrating a test socket for a semiconductor module in accordance with an example embodiment of the present inventive concept. FIG. 9 is a cross-sectional view illustrating an interface inspection pin in FIG. 8. FIG. 10 is a cross-sectional view illustrating a fastening thin film of a module substrate in accordance with an example embodiment of the present inventive concept. FIGS. 11 and 12 are enlarged perspective views illustrating the portion 'E' in FIG. 10.

Referring to FIGS. 1 to 12, a test socket 50 for a semiconductor substrate may include a first body 52, a second body 54, and a plurality of interface inspection pins 300. The first body 52 may include a fixing portion for fixing the semiconductor substrate 20. For example, the fixing portion may be a portion of the first body 52 that presses the semiconductor substrate 20 against the second body 54 to keep the semiconductor substrate 20 in place. The second body 54 may be disposed to face the first body 52 and coupled with the first body 52 such that the second body 54 rotates relative to the first body 52 about a hinge pin 56. The plurality of interface inspection pins 300 may have contact pins 310 and springs 320 for elastically supporting the contact pins 310. The test socket 50 may further include a test board 60 for testing an electronic device 10.

The interface inspection pins 300 of the test socket 50 may come into contact with test terminals 120 of an electronic device 10, and the test socket 50 may perform a test on the electronic device 10 using the test board 60. The test socket 50 may be designed in various ways according to a type of the electronic device 10 to be tested.

For example, the test board 60 may include a T32 connector for performing the test on SSD. For example, the test board 60 may include a JTAG connector for electrical connection with the SSD to proceed with the test. The test hoard 60 may include the T32 connector and the JTAG connector into one board, and a signal length between the T32 connector and the JTAG connector may be reduced to thereby prevent deterioration of signal characteristics that may occur during the test.

The first and second bodies 52 and 54 may have, for example, a rectangular shape, a square shape, or a plate shape, and the semiconductor substrate 20 to be tested may be disposed on the second body 54. For example, the first and second bodies 52 and 54 may include a synthetic resin material having insulation properties. The first and second bodies 52 and 54 may each include a shaft fixing portion. The first body 52 may be interlocked with the second body 54 by the hinge pin 56 passing through the shaft fixing portion such that the second body 54 rotates relative to the first body 52 about the hinge pin 56 as a fixed axis of rotation. Accordingly, to perform the test, an operator or a robot may apply pressure to an end portion of the first body 52 and/or the second body 54 to bring the first body 52 and the second body 54 into contact with each other or to separate them from each other.

The first body 52 may rotate about the hinge pin 56 on the second body 54. A position of the first body 52 may be adjusted such that the interface inspection pins 300 are provided on the test terminal 120 of the semiconductor substrate 20 mounted on the second body 54. Accordingly, the test socket 50 may adjust the position of the second body 54 according to the positions of the test terminals 120 on the semiconductor substrate 20, and the test socket 50 may perform the test on various types of the electronic device.

The interface inspection pin 300 may include a cylindrical body 330, the contact pin 310, and the spring 320. The cylindrical body 330 may be inserted into the first body 52 and may be fixed in the first body 32. The cylindrical body 330 may have an open end portion. The contact pin 310 provided in the open end portion of the body 330, and the spring 320 may press the contact pin toward the open end portion. For example, the spring 320 may resiliently support the contact pin 310. The interface inspection pins 300 may electrically connect the test terminals 120 provided in the semiconductor substrate 20 and the test board 60 to each other to perform the test on the electronic device 10. For example, the interface inspection pin 300 may include a pogo pin.

A driving signal and a test signal may be transmitted through the interface inspection pins 300 between the electronic device 10 and the test board 60. The driving signal and test signal provided to the interface inspection pin 300 may be provided to the contact pin 310 through the body 330, and then the driving signal and the test signal provided to the contact pin 310 may be provided to the test terminal 120 of the semiconductor substrate 20 to perform an electrical test on the electronic device 10. In addition, the driving signal and the test signal provided to the interface inspection pin 300 may be provided to the body 330 through the contact pin 310, and then the driving signal and the test signal provided to the body 330 may be applied to a circuit of the test board 60 to perform the electrical test on the electronic device 10.

For example, the number of the interface inspection pins 300 may be within a range of about 10 to 12. The interface inspection pins 300 may be fixedly provided to respectively penetrate through the first body 52 and may be arranged in, for example, two rows. When the semiconductor substrate 20 to be tested is either 10-pin or 12-pin, the interface inspection pins 300 may be provided corresponding to the positions of the test terminals 120 provided in the semiconductor substrate 20.

The test terminal 120 may be provided to at least partially surround an inner surface of a via hole 110 which penetrates a wiring substrate 100 and may have first and second diameters D1, D2. The contact pin 310 may have a third diameter D3 smaller than each of the first and second diameters D1, D2 and may have a convex shape. Alternatively, the third diameter D3 may be smaller than the first diameter D1 and larger than the second diameter D2. In addition, the third diameter D3 may be larger than each of the first and second diameters D1, D2. Accordingly, when the interface inspection pin 300 descends in a vertical direction, a portion of the contact pin 310 may be inserted into the via hole 110, and the portion of the contact pin 310 may come into contact with the test terminal 120.

Even though the contact pin 310 is in contact with the test terminal 120, the second body 54 may further rotate relative to the first body 52, and thus, as an additional force is applied to the contact pin 310, the contact pin 310 may be moved into the body 330. When the contact pin 310 moves into the body 330, the spring 320 may absorb a shock applied to the contact pin 310. For example, each of the first and second diameters D1, D2 may be within a range of about 0.1 mm to about 1 mm. The third diameter D3 may be within a range of about 0.2 mm to about 1 mm.

A fastening thin film 200 may have a predetermined structure 220 that may be destroyed or penetrated by contacting with the contact pin 310 of the interface inspection pin 300. For example, the predetermined structure 220 may include a concave shape or a convex shape in the vertical direction (Z direction) on the fastening thin film 200. The predetermined structure 220 may have a structure capable of holding the interface inspection pin 300 after being destroyed.

A distal end portion of the contact pin 310 may have a protruding shape for penetrating into the fastening thin film 200. The contact pin 310 may be provided in a shape corresponding to the predetermined structure 220 of the fastening thin film 200. For example, the contact pin 310 may have a convex shape while the predetermined structure 220 has a convex shape. As another example, the contact pin 310 may have a convex shape while the predetermined structure 220 has a concave shape. Since the contact pin 310 and the fastening thin film 200 have structures corresponding to each other, the fastening thin film 200 may be destroyed or penetrated by the interface inspection pin 300 in a test process, and the interface inspection pin 300 may be held by the fastening thin film 200.

Figure 13:
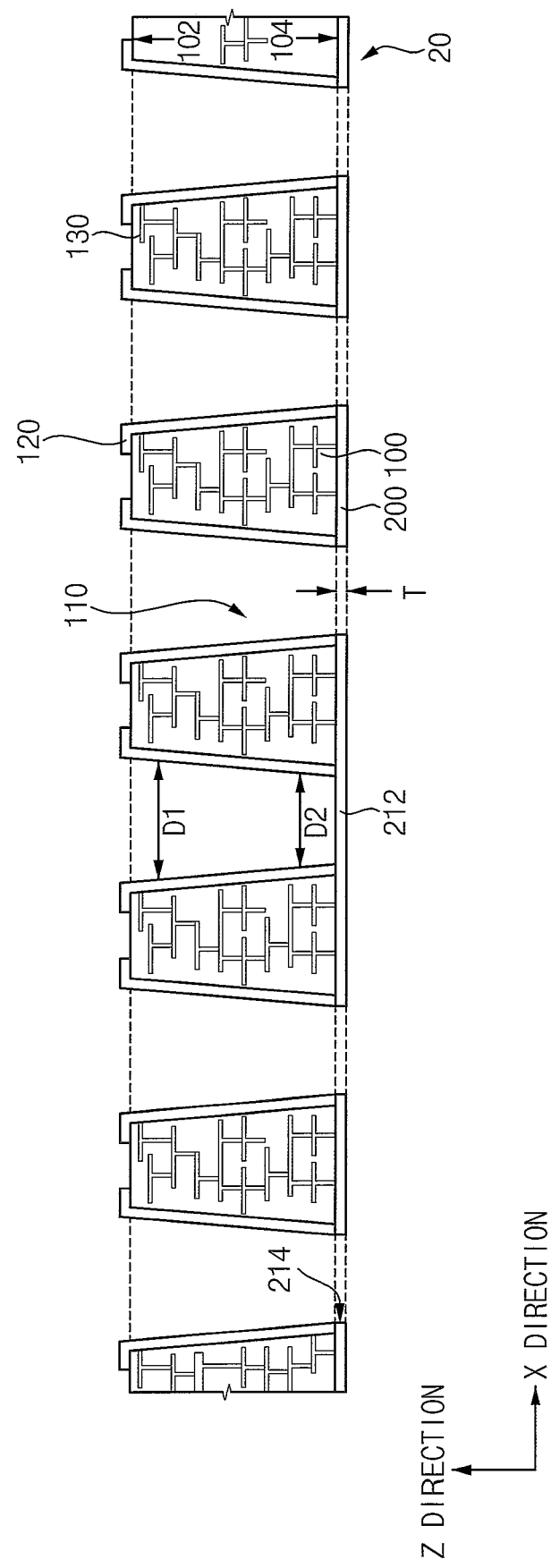
FIG. 13 is a cross-sectional view illustrating a fastening thin film including an opening in accordance with an example embodiment of the present inventive concept.

FIG. 13 is a cross-sectional view illustrating a fastening thin film including an opening in accordance with an example embodiment of the present inventive concept. The semiconductor substrate may be substantially the same as or similar to the module substrate described with reference to FIGS. 1 to 7 except for a configuration of the fastening thin film having the opening. Thus, same or similar components are denoted by the same or similar reference numerals, and repeated descriptions of the same components may be omitted.

Referring to FIGS. 1 to 7 and 13, a module substrate 20 may include a wiring substrate 100 having a plurality of via holes 110, a plurality of test terminals 120 respectively provided on the via holes 110, and a fastening thin film 200 provided on the wiring substrate 100 and having a predetermined thickness.

The fastening thin film 200 may include a blocking portion 212 provided on a lower surface 104 of the wiring substrate 100 and configured to block at least one via hole 110 of the plurality of via holes 110 and at least one opening 214 positioned at other via holes 110 of the plurality of via holes 110. The fastening thin film 200 may be provided in a form of a thin film on the lower surface 104 of the wiring substrate 100.

The blocking portion 212 may be penetrated by the interface inspection pin 300 during a test process, and the interface inspection pin 300 may be held in the fastening thin film during a penetrating process. The fastening thin film 200 may have openings formed by being destroyed or penetrated by the interface inspection pins 300 after the test process. The fastening thin film 200 having the openings formed through the interface inspection pins 300 may have a surface roughness, and the openings may increase a frictional force with the interface inspection pins 300. For example, the blocking portion 212 may be provided on the at least one the via hole 110 on which a terminal among the test terminals 120 is electrically connected to a power voltage VDD of 1.8V is provided.

The opening 214 may provide a path through which the interface inspection pin 300 is inserted during the test process. The interface inspection pins 300 may pass through the test terminals 120 and the opening 214 to be held in the module substrate 20, and then, a test may be performed.

The fastening thin film 200 may be provided on the lower surface 104 of the wiring substrate 100. For example, the fastening thin film 200 may be formed by a Controlled Depth Drilling (CDD) process in a manufacturing process of the module substrate 20. In the controlled drilling process, the opening 214 may be formed when a portion of the fastening thin film 200 is removed to be penetrated, and the blocking portion 212 may be formed when a portion of the fastening thin film is not removed to leave a predetermined thickness T.

Figure 14:
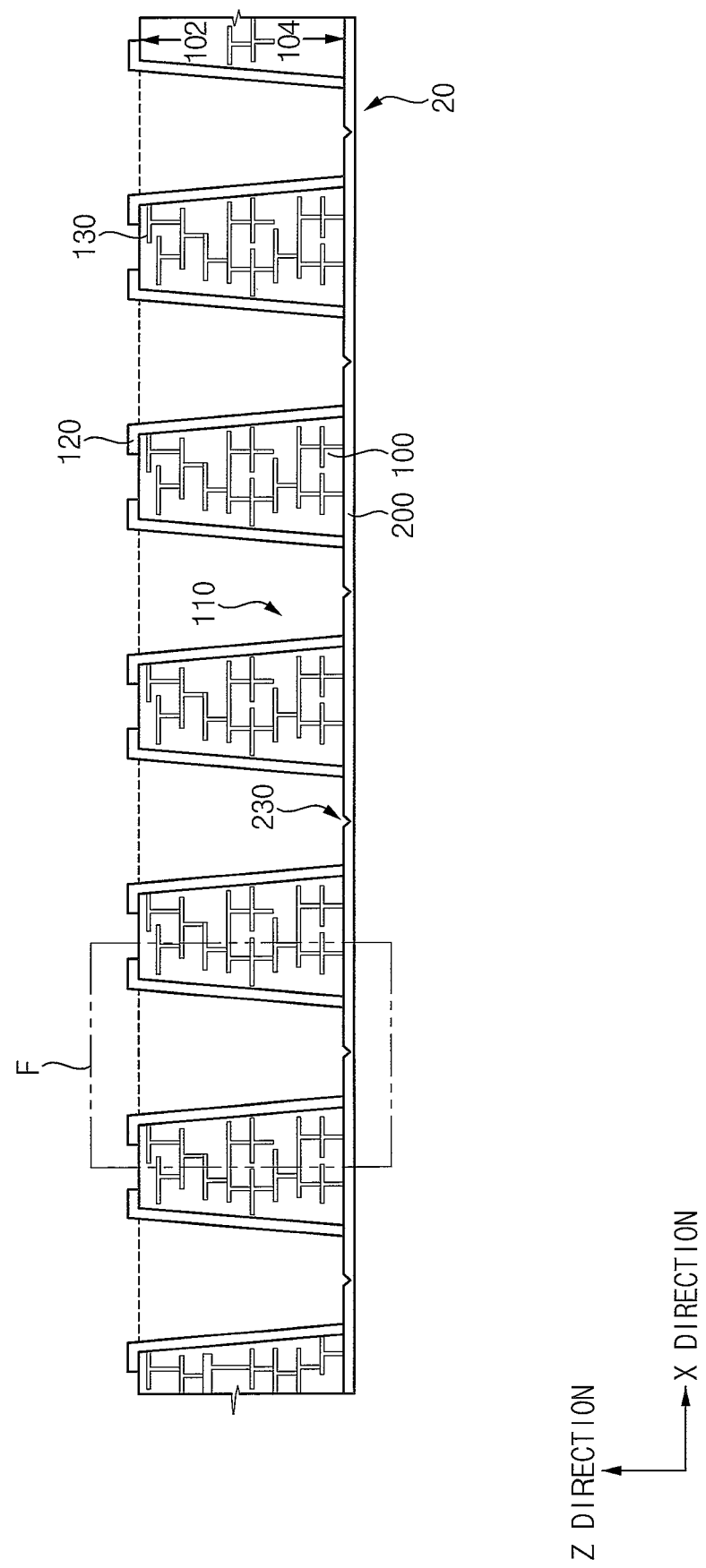
FIG. 14 is a cross-sectional view illustrating a fastening thin film including a predetermined structure in accordance with an example embodiment of the present inventive concept.
Figure 15:
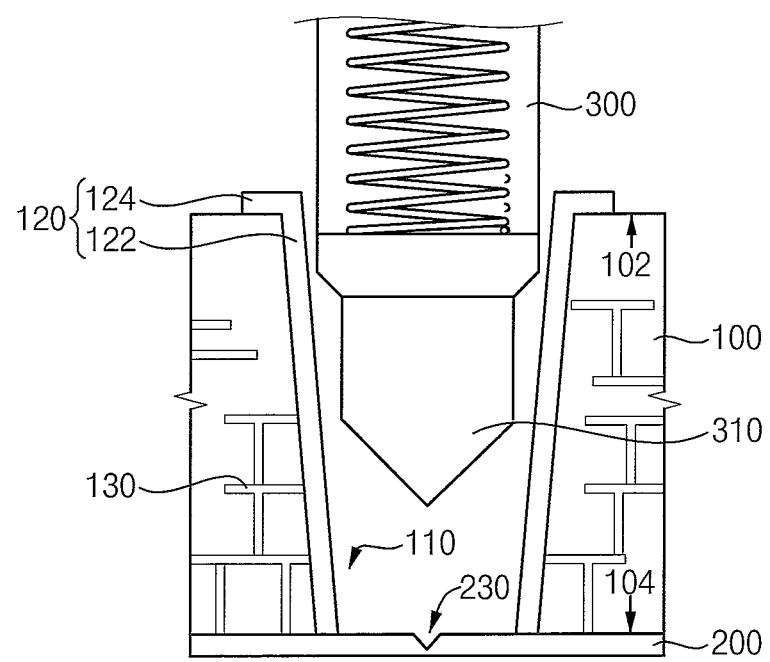
FIG. 15 is an enlarged cross-sectional view illustrating the portion 'F' in FIG. 14.

FIG. 14 is a cross-sectional view illustrating a fastening thin film including a predetermined structure in accordance with an example embodiment of the present inventive concept. FIG. 15 is an enlarged cross-sectional view illustrating the portion 'F' in FIG. 14. The test socket for the semiconductor substrate may be substantially the same as or similar to the test socket described with reference to FIGS. 8 to 12 except for configurations of the predetermined structure of the fastening thin film and the contact pins of the interface inspection pins. Thus, same or similar components are denoted by the same or similar reference numerals, and repeated descriptions of the same components may be omitted.

Referring to FIGS. 14 and 15, a fastening thin film 200 may have a predetermined structure 230 to be destroyed or penetrated by contacting with contact pins 310 of interface inspection pins 300. For example, the predetermined structure 230 may include a recessed shape in the vertical direction (Z direction) on the fastening thin film 200. For example, a thickness of a portion of the fastening thin film 200 below the lower surface of the predetermined structure 230 is less than thicknesses of other portions of the fastening thin film 200.

A distal end portion of the contact pin 310 may have a shape for penetrating the fastening thin film 200. The distal end of the contact pin 310 may have a conical shape for penetrating the fastening thin film 200. The contact pin 310 may be provided in the shape corresponding to the recessed shape of the fastening thin film 200. Since the contact pin 310 and the fastening thin film 200 have structures corresponding to each other, the fastening thin film 200 may be destroyed or penetrated by the interface inspection pin 300 in a test process, and the interface inspection pin 300 may be held by the fastening thin film 200.

While the present inventive concept has been described with reference to example embodiments thereof, it will be understood by those of ordinary skill in the art that various changes in form and details may be made thereto without departing from the spirit and scope of the present inventive concept.

What is claimed is:

1. A module substrate for a semiconductor module, comprising:
    a wiring substrate having an upper surface and a lower surface opposite to the upper surface, wherein the wiring substrate includes a circuit wiring and a plurality of via holes extending from the upper surface to the lower surface in a thickness direction;
    a plurality of test terminals respectively provided on the via holes and electrically connected to the circuit wiring; and
    a fastening thin film provided on the wiring substrate and covering the via holes,
    wherein the fastening thin film has a predetermined thickness such that a portion of the fastening thin film is penetrated when an interface inspection pin is inserted into the portion of the fastening thin film through the via hole from the upper surface, and the portion of the penetrated fastening thin film holds the penetrating interface inspection pin.

2. The module substrate of claim 1, wherein the predetermined thickness of the fastening thin film is within a range of about 1 μm to about 200 μm.

3. The module substrate of claim 1, wherein the test terminal is provided in a form of a thin film on an inner surface of the via hole, wherein the test terminal has a first diameter on the upper surface of the wiring substrate and a second diameter on the lower surface of the wiring substrate, wherein the second diameter is equal to or smaller than the first diameter.

4. The module substrate of claim 3, wherein each of the first diameter and the second diameter are within a range of about 0.1 mm to about 1 mm.

5. The module substrate of claim 1, wherein the test terminal includes,
    a first terminal pattern provided in a form of the thin film on an inner surface of the via hole passing through the wiring substrate; and
    a second terminal pattern extending from the first terminal pattern on the upper surface of the wiring substrate.

6. The module substrate of claim 1, wherein the fastening thin film includes a resin.

7. The module substrate of claim 1, wherein the test terminal includes at least one of copper (Cu), aluminum (Al), tungsten (W), nickel (Ni), molybdenum (Mo), gold (Au), silver (Ag), chromium (Cr), tin (Sn) or titanium (Ti).

8. The module subsume of claim 1, wherein the fastening thin film further includes a predetermined structure at a position corresponding to the interface inspection pin such that the portion of the fastening thin film that comes into contact with the interface inspection pin is penetrated, and
the predetermined structure includes a concave shape or a convex shape.

9. The module substrate of claim 1, wherein the circuit wiring is a circuit pattern for driving a solid state drive (SSD).

10. The module substrate of claim 1, wherein the interface inspection pin includes a contact pin for contacting the test terminal, and
a distal end portion of the contact pin has a convex shape for penetrating the fastening thin film.

11. A semiconductor module, comprising:
a wiring substrate having first and second surfaces opposite to each outer, wherein the wiring substrate includes a circuit wiring and a plurality of via holes formed through the wiring substrate in a thickness direction;
at least one semiconductor device mounted on the wiring substrate and electrically connected to the circuit wiring;
a plurality of test terminals respectively provided on the via holes and electrically connected to the circuit wiring to electrically test the at least one semiconductor device; and
a fastening thin film provided on the wiring substrate and covering the via holes, wherein the fastening thin film has a predetermined thickness within a range of about 1 μm to about 200 μm,
wherein the fastening thin film is penetrated by an interface inspection pin inserted through a first via hole of the plurality of via holes from the first surface, and a portion of the penetrated fastening thin film contacts and holds the penetrating interface inspection pin.

12. The semiconductor module of claim 11, wherein the test terminal is provided in a form of a thin film ort an inner surface of the via hole, wherein the test terminal has a first diameter on the first surface of that wiring substrate and a second diameter on the second surface of the wiring substrate, wherein the second diameter is equal to or smaller than the first diameter.

13. The semiconductor module of claim 12, wherein each of the first diameter and the second diameter are within a range of about 0.1 mm to about 1 mm.

14. The semiconductor module of claim 11, wherein the test terminal includes,
a first terminal pattern provided in a form of the thin film on an inner surface of the via hole passing through the wiring substrate; and
a second terminal pattern extending from the first terminal pattern on the first surface of the wiring substrate.

15. The semiconductor module of claim 11, wherein the fastening thin film includes a resin.

16. The semiconductor module of claim 11, wherein the test terminal includes at least one of copper (Cu), aluminum (Al), tungsten (W), nickel (Ni), molybdenum (Mo), gold (Au), silver (Ag), chromium (Cr), tin (Sn) or titanium (Ti).

17. The semiconductor module of claim 11, wherein the fastening thin film further includes a predetermined structure at a position corresponding to the interface inspection pin such that the portion of the fastening thin film that comes into contact with the interface inspection pin is penetrated, and
the predetermined structure includes a concave shape or a convex shape.

18. The semiconductor module of claim 11, wherein the semiconductor device includes a nonvolatile memory device and a controller electrically connected to the nonvolatile memory device.

19. The semiconductor module of claim 11, wherein the interface inspection pin includes a contact pin for contacting the test terminal, and
a distal end portion of the contact pin has a convex shape for penetrating the fastening thin film.

20. A test socket for a semiconductor substrate, comprising:
a first body including a fixing portion for fixing the semiconductor substrate;
a second body disposed to face the first body, wherein the second body is coupled with the first body such that the second body rotates relative to the first body about a hinge pin as a fixed axis of rotation; and
a plurality of interface inspection pins, wherein each of the interface inspection pins has a convex shaped contact pin and a spring connected to the contact pin, wherein each of the convex shaped contact pins is provided in a first end portion of each of the interface inspection pins,
wherein the semiconductor substrate includes,
a wiring substrate having a first surface and a second surface opposite to each other, wherein the wiring substrate includes a plurality of via holes extending from the first surface to the second surface, wherein an interface inspection pin of the plurality of interface inspection pins is inserted through a via hole of the plurality of is holes;
a test terminal provided on an inner surface of the via hole to be in contact with a contact pin of the interface inspection pin of the plurality of interface inspection pins; and
a fastening thin film being provided on the second surface, wherein the fastening thin film has a predetermined thickness and a predetermined structure such that a portion of the fastening thin film is penetrated by the contact pin to hold the interface inspection pin in place.

* * * * *